United States Patent [19]

Vajgart et al.

[11] Patent Number: 5,060,156
[45] Date of Patent: Oct. 22, 1991

[54] METHOD AND APPARATUS FOR DETERMINING ENGINE OIL CHANGE INTERVALS ACCORDING TO ACTUAL ENGINE USE

[75] Inventors: Jeffery L. Vajgart, Corunna; Peter W. Misangyi; Parshuram G. Date, both of Novi; Roger S. Heitzeg, Dearborn Heights; Noel A. Walker, Royal Oak; David A. McNamara, Saline; Joe C. Attard, Dearborn, all of Mich.

[73] Assignee: Ford Motor Company, Dearborn, Mich.

[21] Appl. No.: 382,515

[22] Filed: Jul. 20, 1989

[51] Int. Cl.⁵ .................. G01D 1/00; G06F 15/20
[52] U.S. Cl. .................. 364/424.03; 340/450.7; 340/449; 73/64
[58] Field of Search .................. 364/550, 551.01, 581, 364/424.03, 424.04, 431.03; 340/450.3, 457, 457.4, 438, 439, 449; 123/196 S, 196 R, 198 D; 73/64

[56] References Cited

U.S. PATENT DOCUMENTS

| | | | |
|---|---|---|---|
| 3,526,127 | 9/1970 | Sarkis | 73/64 |
| 3,593,012 | 7/1971 | Lang | 235/193 |
| 4,258,421 | 3/1981 | Juhasz et al. | 364/424.04 |
| 4,277,772 | 7/1981 | Kastura et al. | 340/52 F |
| 4,497,200 | 2/1985 | Tournier | 73/64 |
| 4,506,337 | 3/1985 | Yasuhara | 364/550 |
| 4,525,782 | 6/1985 | Wohlfarth et al. | 364/431.01 |
| 4,533,900 | 8/1985 | Muhlberger et al. | 340/52 R |
| 4,677,847 | 7/1987 | Sawatari et al. | 73/64 |
| 4,694,793 | 9/1987 | Kawakita et al. | 123/196 S |
| 4,706,193 | 11/1987 | Imajo et al. | 364/424 |
| 4,733,556 | 3/1988 | Meitzler et al. | 73/64 |
| 4,741,200 | 5/1988 | Hammerle | 73/54 |
| 4,742,476 | 5/1988 | Schwartz et al. | 364/550 |
| 4,785,287 | 11/1988 | Honma et al. | 73/64 X |
| 4,796,204 | 1/1989 | Inoue | 364/550 |
| 4,845,623 | 7/1989 | Korb | 364/431.03 |
| 4,847,768 | 7/1989 | Schwartz et al. | 364/424.03 |
| 4,862,393 | 8/1989 | Reid et al. | 364/550 |
| 4,884,054 | 11/1989 | Moon, Sr. | 364/424.03 X |
| 4,970,492 | 11/1990 | King | 340/439 |

*Primary Examiner*—Joseph L. Dixon
*Attorney, Agent, or Firm*—Paul K. Godwin, Jr.; Clifford L. Sadler

[57] ABSTRACT

Engine lubricating oil temperature and the amount of engine usage are used to calculate when engine lubricating oil has reached the end of its predicted wear life. Each spark (engine speed) pulse is multiplied by weighting factors that are periodically determined by sampling the engine oil temperature and the length of time the engine has been in continuous use above a predetermined speed. When the value of the accumulated weighted spark pulses has reached a predetermined level, a warning signal is provided to indicate the necessity of changing the engine lubricating oil.

1 Claim, 9 Drawing Sheets

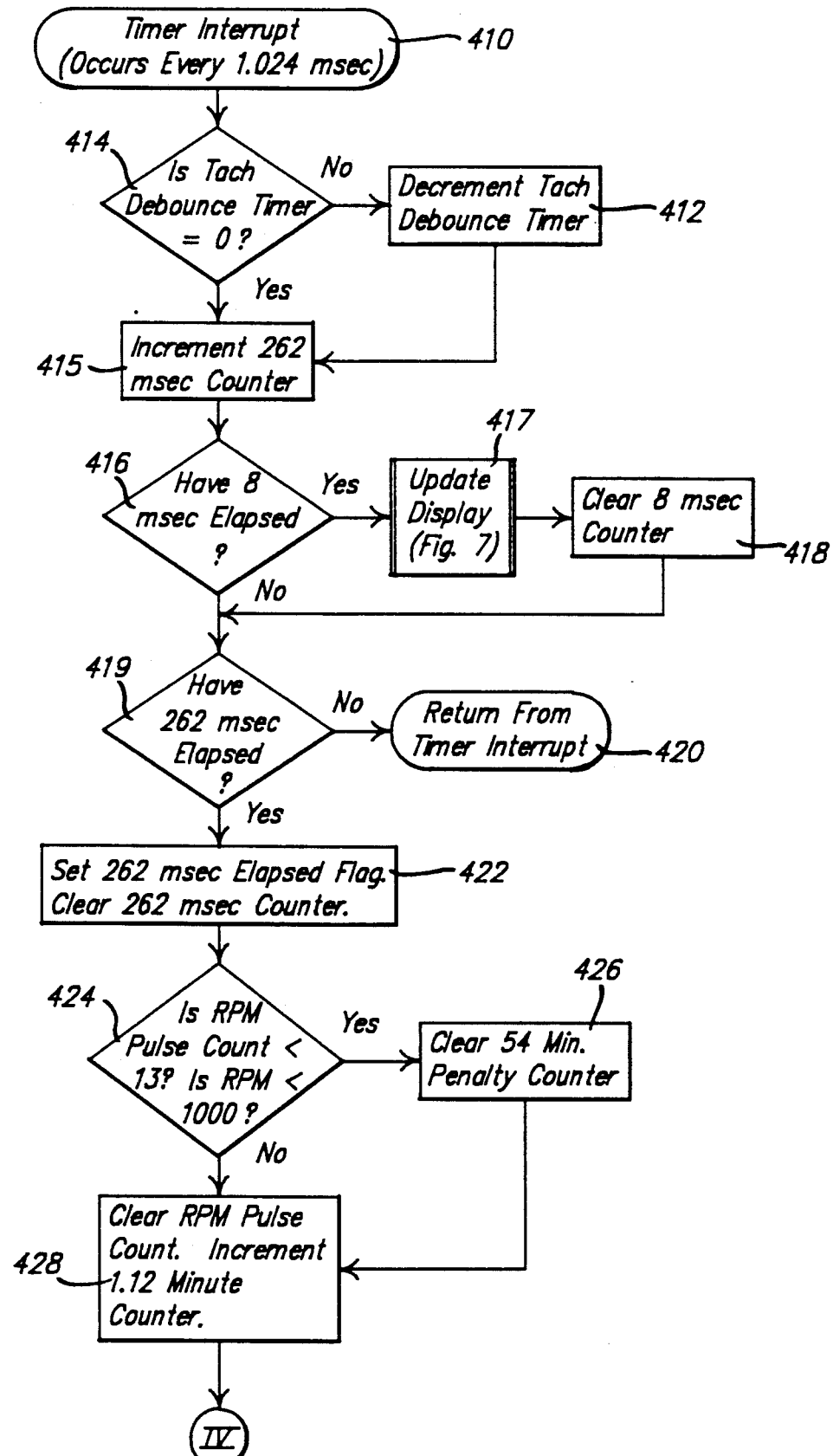
FIG. 4.a.

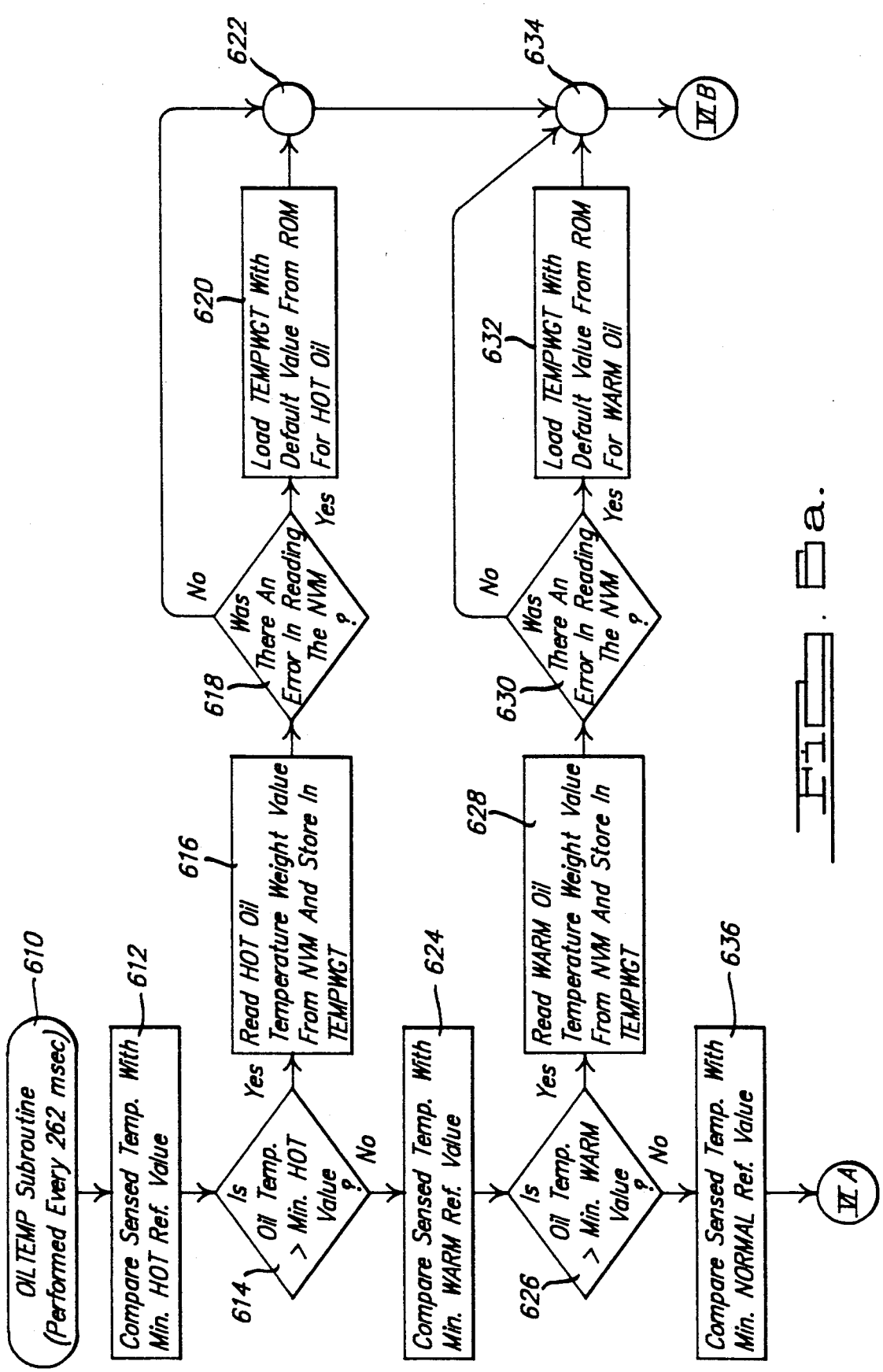

|  | A | B | C | |
|---|---|---|---|---|
| Min. Hot (275° F) | 1 | 1 | 0 | Above Min. Hot |
|  |  |  | 1 | Below Min. Hot |
| Min. Warm (250° F) | 1 | 0 | 0 | Above Min. Warm |
|  |  |  | 1 | Below Min. Warm |
| Min. Normal (140° F) | 0 | 1 | 0 | Above Min. Normal |
|  |  |  | 1 | Below Min. Normal |
| Min. Cool (40° F) | 0 | 0 | 0 | Above Min. Cool |
|  |  |  | 1 | Below Min. Cool = Cold |

METHOD AND APPARATUS FOR DETERMINING ENGINE OIL CHANGE INTERVALS ACCORDING TO ACTUAL ENGINE USE

FIELD OF THE INVENTION

The present invention is directed to the area of engine oil wear indicators and more specifically to the methods and apparatus used to determine engine oil wear by measuring engine usage parameters.

BACKGROUND OF THE INVENTION

Several attempts have been made to provide onboard indicators for the purpose of notifying an operator that the lubricating oil of an associated internal combustion engine is in need of being replaced.

U.S. Pat. Nos. 4,733,556 and 4,741,200 describe the use of sensors which directly measure various properties of lubricating oil and provide indications of when those properties change beyond predetermined limits.

Other systems have been described in which particular engine operating parameters are determined as being key to the effects of oil degradation and wear. Several patents, including the following, describe techniques for measuring operating parameters and inferring oil degradation based upon such measurements.

U.S. Pat. No. 4,506,337 teaches that soot suspended in lubricating oil is associated with its degradation and the amount of soot in the oil is strictly dependent on the number of engine revolutions, load, and EGR rate. That patent presents a system for providing driver notification of the need to replace lubricating oil based upon a soot calculation algorithm in response to parameter inputs from an engine speed sensor and an engine load sensor.

U.S. Pat. No. 4,694,793 senses the alkalinity and the oil level within the lubricating oil sump of an internal combustion engine. It is said that the reaction between alkaline content and metal contaminants in the oil increases with elevated temperature. Engine speed and temperature are used to predict the affect on the longevity of the oil from the standpoint of infusible matter contamination.

U.S. Pat. No. 4,497,200 senses the time lubricating oil is present in a motor. The running time of the engine is sensed and is provided as a current. The running time current is summed with both a current indicating the idle period and with a current proportional to temperature variations, either below or above a satisfactory operating temperature. The sum of those currents is integrated until a particular threshold is detected. Once that threshold is exceeded, the system provides a signal to indicate the necessity of an oil change.

U.S. Pat. No. 4,706,193 senses the distance traveled by a vehicle, the temperature of the lubricating oil, the speed the engine is operating and the type of oil used. All sensor outputs are multiplied by weighed coefficients. They are added and that sum is integrated over time. When the integrated value exceeds a predetermined level, a warning signal is given to the driver. The described system also adjusts the predetermined level whenever oil is sensed as being added to that which is already present.

U.S. Pat. No. 4,525,782 senses the lubricating oil condition indirectly by monitoring fuel consumption. In that patent a value corresponding to a specific quantity of fuel consumption is stored as a reference, and oil wear is determined as a function of the difference between the actual fuel consumed and the stored value.

U.S. Pat. No. 4,533,900 discloses a system that measures lubricating oil temperature, engine speed, and a rate of fuel consumption. It also measures distance traveled by the vehicle. In that system, a service warning is displayed after a predetermined distance has been traveled, wherein the distance is composed of the actual distance traveled and an additional engine loading component calculated as a function of the load on the engine.

U.S. Pat. No. 4,677,847 teaches a system which monitors the engine running time, the oil temperature and the engine speed to determine the rate of deterioration of lubricating oil. It provides a continuous output signal that represents the remaining useful life of the oil when desired by the driver. That system estimates a time in the future when the oil will reach undesirable deterioration levels. The time prediction is displayed as mileage remaining before the oil change is required.

U.S. Pat. No. 4,742,476 describes an automatic engine oil change indicator system in which only the engine oil temperature and engine speed are sensed to determine the wear life of lubricating oil in an internal combustion engine. An effective oil usage amount is periodically computed by multiplying accumulated engine revolutions (actual measured revolutions during the period) by a penalty factor which is determined as a sole function of the engine oil temperature as it relates to empirically determined data without regard to the engine load. Oil change indication is also provided by a one year clock or a 7,500 mile limit between changes.

SUMMARY OF THE INVENTION

In contrast to the prior art systems and the more recently disclosed systems, the present invention provides for a lubricating oil change indicating system which senses the temperature of lubricating oil as well as the speed of engine operation and the time the engine is in continuous operation above a predetermined speed. The system determines a multiplying factor that is applied to each measured pulse from the speed sensor according to the temperature of the engine oil and the time the engine is in continuous operation above a predetermined speed. The product resulting from each output pulse of the speed sensor being multiplied by the then current weighting factor is accumulated and compared with a predetermined value that corresponds to a prescribed wear limit for the lubricating oil. When the accumulated value increases to a point where it exceeds the predetermined value, a signal is provided to the operator of the engine (vehicle driver) to indicate that the oil has exceeded its wear life and needs to be changed. The system is resettable to indicate that an oil change has been made.

The rate at which the engine oil breaks down has been empirically determined to vary according to the temperature of the oil and the amount of work to which the oil was subjected. In this invention, the useful wear life of engine lubricating oil is primarily determined by monitoring the operating temperature of the engine oil and the extent of engine use. The invention determines the time to change the engine oil based upon the historical accumulation of actual engine operating conditions as a function of monitoring each engine ignition spark, oil temperature and length of continuous use of the engine above a predetermined speed. Every ignition coil (spark) pulse is counted since the occurrence of those pulses are directly related to engine speed and are commonly used as tachometer pulses. Each pulse is multiplied by a weighting factor that is dependent upon the engine oil temperature and the length of time the engine has been operating above a predetermined speed level. A nominal weighting factor is selected as the norm for oil which is sensed as being in a predetermined normal range of temperatures. The weighting factors are larger for engine oil temperatures sensed as being hotter or colder than the normal range of engine oil temperatures. The weighting factors are also larger for normal engine oil temperatures when the engine has been found to be in continuous operation for more than a predetermined amount of time above a predetermined speed (rpm). The weighted ignition coil pulses are added together and stored in a nonvolatile memory for storage when the engine is turned off. A display indicates that the engine oil should be changed "SOON", when the sum or those weighted pulses reaches 90 percent of a predetermined total and "NOW", when 100 percent of the total is reached. The predetermined total of weighted pulses and the temperature range levels may vary according to each type of vehicle engine, and the microcomputer employed to make the calculations will be programmed accordingly.

It is an object of the present invention to provide both method and apparatus for indicating when the lubricating oil used in an internal combustion engine has exceeded its useful wear life by measuring engine operation characteristics of engine speed, oil temperature and time of continuous engine operation above a predetermined speed level.

It is another object of the present invention to provide a lubricating oil change indicating method and apparatus that periodically senses the temperature and time the engine has been continuously operating above a predetermined speed level to assign a then current weighting factor which is utilized for a period of time against each sampled speed pulse in calculating actual oil wear against a predetermined wear life value.

BRIEF DESCRIPTION OF THE DRAWINGS

FIGS. 4a and 4b together constitute a flow diagram of the "Timer Interrupt" subroutine utilized in the present invention.

FIGS. 6a and 6b together constitute a flow diagram of the oil temperature read "Oil Temp." subroutine that is called up by instruction 244 in FIG. 2.

DETAILED DESCRIPTION OF THE PREFERRED EMBODIMENT

Figure 1:
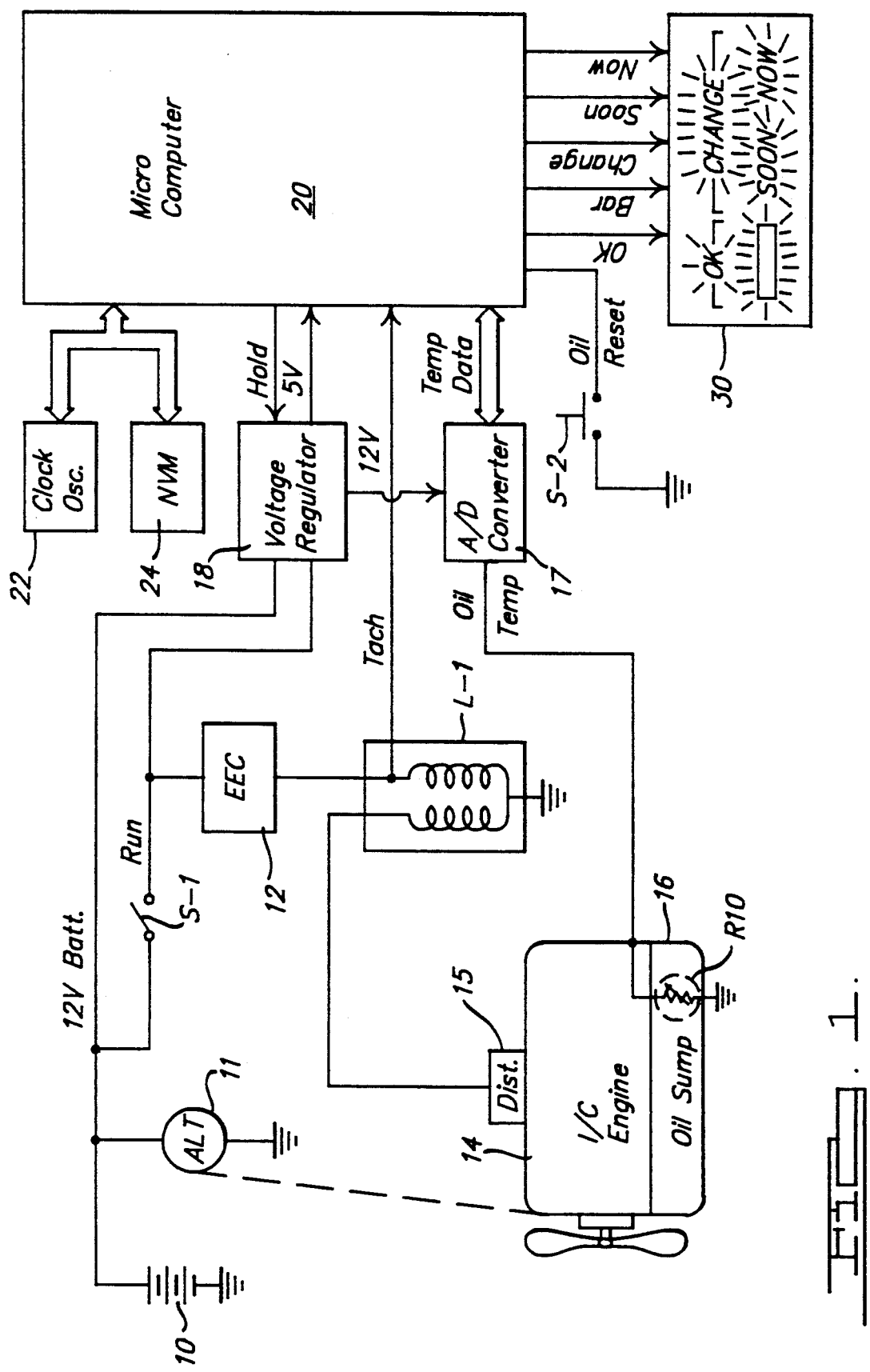
FIG. 1 is a block diagram indicating the major components of the present invention.

In FIG. 1, an internal combustion engine 14 is represented as having a lubricating oil sump 16. A 12 volt battery 10 and an engine driven alternator 11 supply DC power to the engine ignition system and to other vehicle loads. An ignition switch S-1 is between the positive terminal of the battery 10 and the various loads which are only powered when the switch S-1 is closed to its "RUN" position. An electronic engine control (EEC) module 12 is powered by the 12 volts D.C. supplied through ignition switch S-1 and, in conjunction with throttle inputs (not shown), supplies low voltage spark pulses to a step-up ignition coil L-1. The coil L-1 operates in a conventional manner to supply high voltage pulses to a distributor 15 where they are switchably supplied to associated spark plugs on the engine 14.

A microcomputer 20 is utilized in the present invention to provide the calculations based upon certain inputs of engine performance and oil temperature and to supply output signals to a display device 30 indicating the wear-life condition of the lubricating oil.

An oil temperature sensor (thermistor element) R10 is provided in the oil sump 16 of the engine 14. Temperature sensor R10 has a characteristic range of resistance values determined by its environmental temperature. In this case, the temperature sensor R10 has resistance values which inversely vary as the temperature. At lower temperatures, its resistance is relatively high. Its resistance value decreases as the temperature increases. The temperature sensor R10 is connected to a A/D converter 17, which is detailed in FIG. 8.

A voltage regulator 18 is provided to supply both 12 volts to the A/D converter 17 and a regulated 5 volts to the microcomputer 20. The microcomputer 20 utilizes the voltage regulator 18 to provide a "keep alive" function with respect to both the 5 volt and 12 volt supply for a period of time following the opening of the ignition switch S-1. The "keep alive" function provides time for proper shut down of the microcomputer 20, including storage of all of the collected data.

A nonvolatile memory (NVM) 24 provides for the permanent storage of data collected by the microcomputer 20.

A clock oscillator 22 is provided for all the timekeeping functions and instructional sequence used in the microcomputer 20.

The following is a general description of the operation of the microcomputer 20, prior to discussing the flow diagrams of FIGS. 2-7.

Approximately every 1.024 msec., the Timer Interrupt subroutine causes several counters to be incremented and makes inquiries regarding elapsed times between certain periodically occurring events. For instance: every 8 msec. the display 30 is updated (refreshed) according to the Update Display subroutine shown in FIG. 7; every 262 msec. the oil temperature is sampled and weighting factors are determined based upon the temperature of the oil and the time the engine has been in operation above a predetermined speed level; and every 262 msec. accumulated weighted speed pulses are checked to determine if the value of the accumulation is sufficient to be added to the nonvolatile memory.

Figure 3:
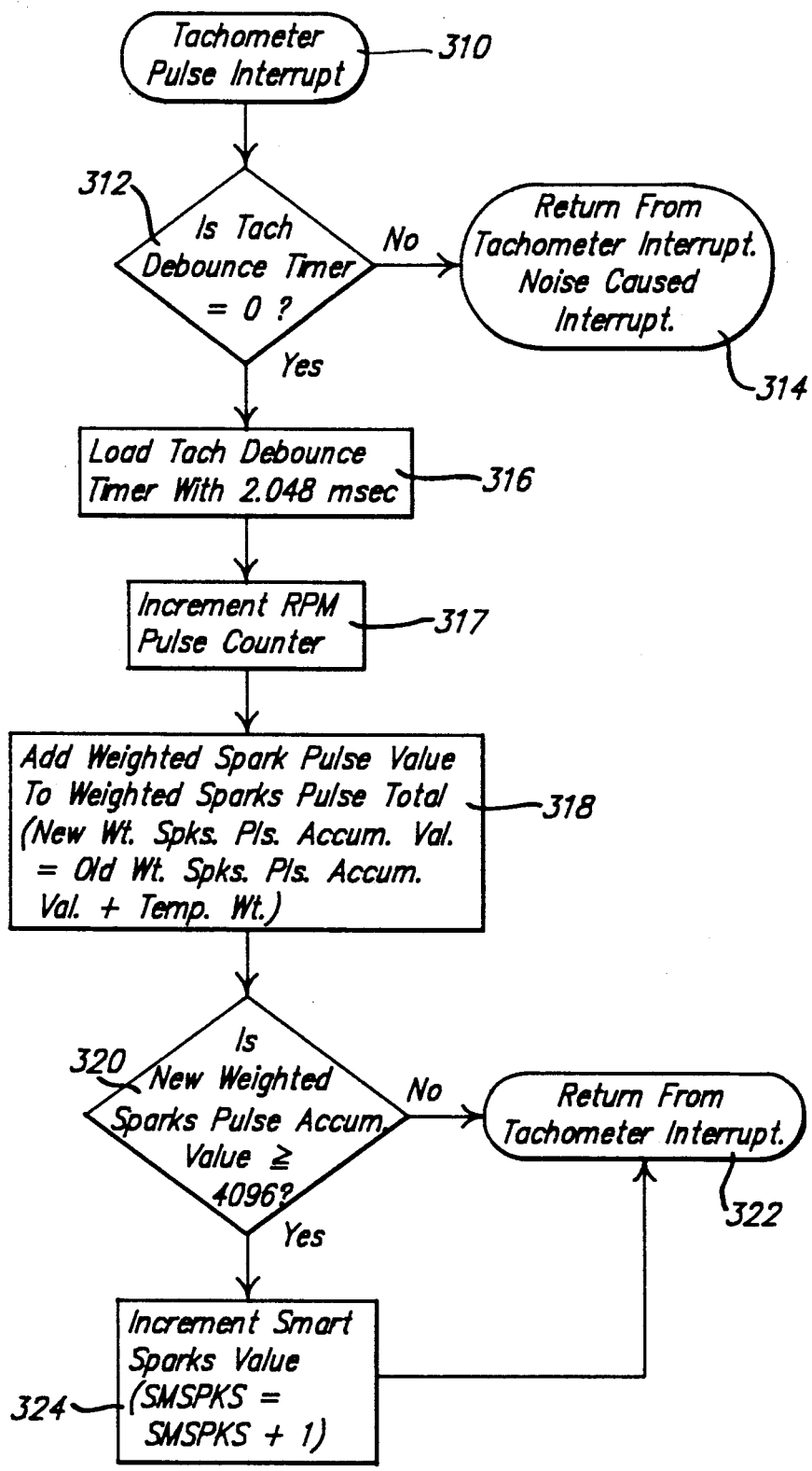
FIG. 3 is a flow diagram of the "Tachometer Pulse Interrupt" subroutine utilized in the present invention.

Upon the occurrence of each spark pulse applied to the primary of the coil L-1 by the EEC that corresponds to a spark being generated in a cylinder of the engine, the Main Loop program is interrupted; and the Tachometer Pulse Interrupt subroutine, shown in FIG. 3, processes that spark pulse by giving it a value according to the current weighting factor "TEMP WGT" then in existence. That becomes a "Weighted Spark Pulse Value" which is then added to the previous "Weighted Spark Pulse Accumulation Value" to create a new Weighted Spark Pulse Accumulation Value. When the new Weighted Spark Pulse Accumulation Value has reached a predetermined level, a second level counter "Smart Sparks" is incremented and stored in RAM. When the Smart Sparks counter is incremented high enough, the value is added to the "Accumulated Smart Sparks Value" read from the associated NVM and stored therein.

The condition of the oil wear-life is displayed according to the Accumulated Smart Sparks Value. By periodically comparing that value with predetermined reference values, the appropriate condition of the oil is logically determined and displayed in accordance with the Update Display subroutine shown in FIG. 7.

Figure 2:
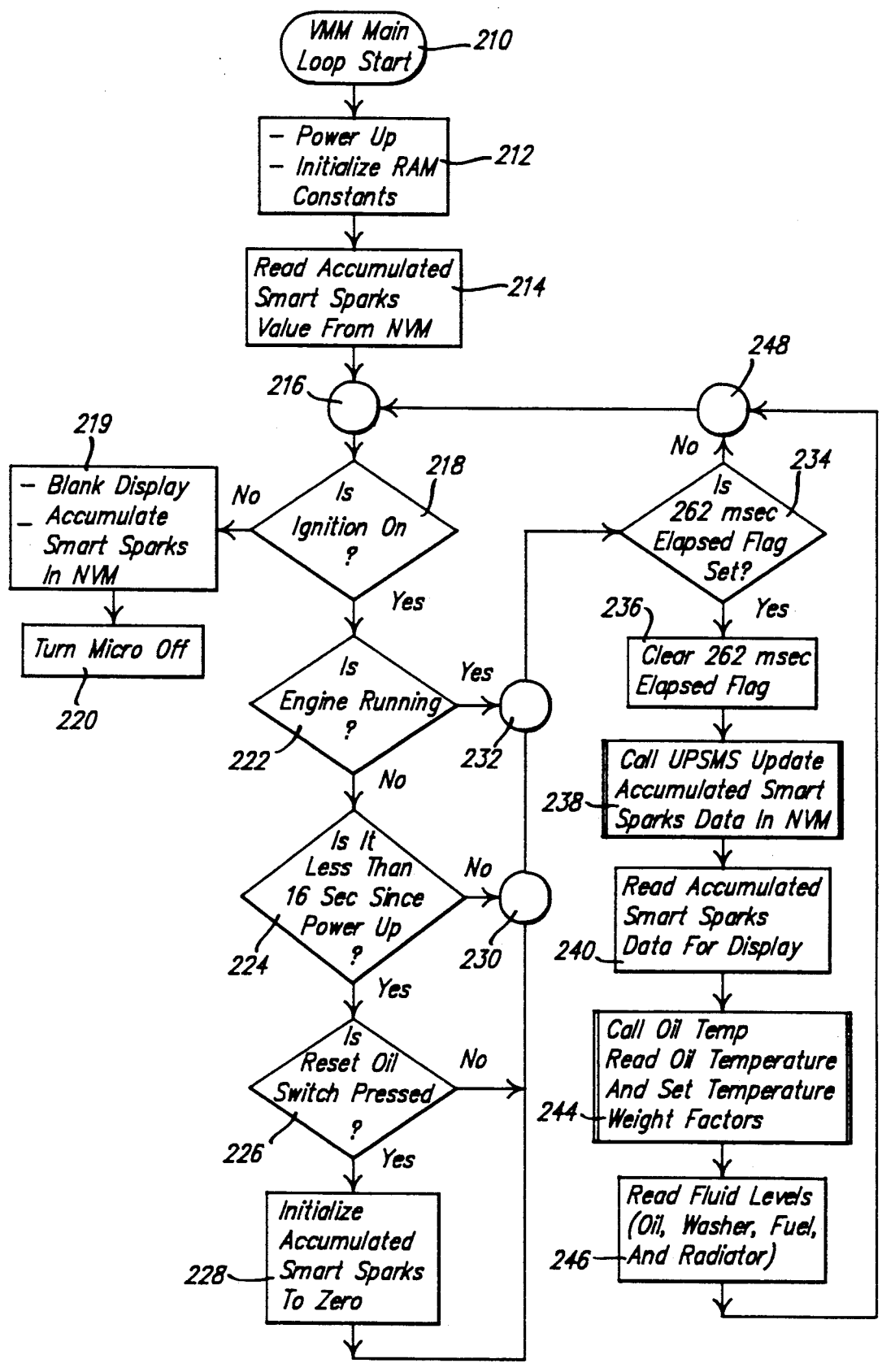
FIG. 2 is a flow diagram summarizing the instructional steps followed in the "Main Loop" of the program utilized in the present invention.

FIG. 2 is a flow diagram of the steps employed in the Main Loop program of the Vehicle Maintenance Monitor (VMM) system in which the present invention is included. The Main Loop program starts at instruction 210, when the ignition switch S-1 is switched from an open to a closed position and electrical power is applied to the system. At instruction 212 all random access memory (RAM) constants are initialized. At instruction 214 the Accumulated Smart Sparks Value is read from the NVM 24.

Passing through junction 216, decision step 218 inquires whether the ignition switch S-1 is closed. If the switch is open during this check, the Main Loop program diverts to instruction 219 which causes the display 30 to be blanked and the value of Accumulated Smart Sparks to be stored in the NVM 24. Following instruction 219, the microprocessor 20 is then turned off in instruction 220 by releasing the Hold line to the voltage regulator 18 (shown in FIG. 1). If the ignition switch S-1 is closed during the decision step 218, the next decision step 222 inquires to see if the engine is running.

If the engine is not running, an inquiry is made at 224 to determine if it has been less than 16 seconds since the ignition switch S-1 has been turned on. If it is within that 16-second period, decision step 226 allows the reset switch inquiry to be made at 226. This is used when the lubricating oil has been replaced and the system needs to be reset. If reset switch S-2 (see FIG. 1) is depressed during decision step 226, the Accumulated Smart Sparks value is initialized to zero (0) at 228. If, on the other hand, the period since the ignition switch S-1 has been turned on is greater than 16 seconds, the time period is outside the reset window and decision step 224 returns through junctions 230 and 232 to the next decision step 234.

If the engine is determined to be running at decision step 222, the program proceeds through junction 232 to the next decision step 234.

At decision step 234, inquiry is made as to whether the 262 msec. elapsed flag is set. If that flag is not set, the program returns through junction 248 and 216 to decision step 218 in the Main Loop. On the other hand, if the 262 msec. elapsed flag is set, the Main Loop program proceeds to instruction 236 where the 262 msec. elapsed flag is cleared. Subsequently, at instruction 238, the "Update Smart Sparks" subroutine (FIG. 5) is called in order that data may be added to the NVM 24 if a sufficient accumulation of Smart Sparks data is found. Following the running of the Update Smart Sparks subroutine called out in instruction 238, the Accumulated Smart Sparks data is read from the NVM for display at instruction 240. (The actual updating of the display is carried out in the Timer Interrupt subroutine described with regard to FIG. 4.) In instruction 244, the Oil Temp subroutine is called and the weight factors are set. (This subroutine is described in detail with respect to FIGS. 6a and 6b.) Other information values are read in instruction 246 which relate to the fluid levels associated with the vehicle engine. Fluid levels such as oil, window washer fluid, fuel and radiator coolant are read in instruction 246 and the Main Loop program progresses to junction 248 and back to junction 216 to complete the loop and begin again at decision step 218.

The Tachometer Pulse Interrupt subroutine, shown in FIG. 3, interrupts the Main Loop program upon the occurrence of a tachometer pulse being generated by the speed sensor (in this case, the pulse supplied to the primary of the coil L-1 in FIG. 1) and commences with the interrupt instruction 310. A "Debounce Timer" loaded with a 2.048 msec. value upon receipt of the previous tachometer pulse counts down. If the Debounce Timer has not completed its countdown to zero (0), the subroutine is terminated at instruction 314 and returned to the Main Loop program. It is assumed by this debounce timing that pulses less than 2.048 msec. apart are attributed to noise rather than valid tachometer pulses. However, if the tachometer Debounce Time has reached zero (0) at inquiry step 312, the Debounce Timer is again loaded with a 2.048 msec. value at instruction 316 to await the occurrence of the next tachometer pulse. An RPM Pulse Counter is incremented at instruction 317. At instruction 318, a Weighted Spark Pulse Value is determined by the value of the "TEMP WGT", which is assigned according to the Oil Temp (temperature sensing) subroutine described below in conjunction with FIG. 6. A Weighted Spark Pulse Value determination is triggered upon the occurrence of the single tachometer pulse with a value of 1 multiplied by the assigned TEMP WGT factor (equivalent to the TEMP WGT). The Weighted Spark Pulse Value is added to the previous total (old Weighted Spark Pulse Accumulation Value) to obtain a new Weighted Spark Pulse Accumulation Value. At decision step 320, the new Weighted Spark Pulse Accumulation Value is checked to determine if it is greater than or equal to a predetermined value (4,096 in this example). If the new Weighted Spark Pulse Accumulation Value is greater than or equal to the predetermined value, a second level counter "Smart Sparks Value" is incremented at instruction 324. If the new Weighted Sparks Value is less than the predetermined value, the Tachometer Pulse Interrupt subroutine is returned to the Main Loop at instruction 322 and that new value serves as the old value when the next tachometer pulse if received.

Figure 4B:
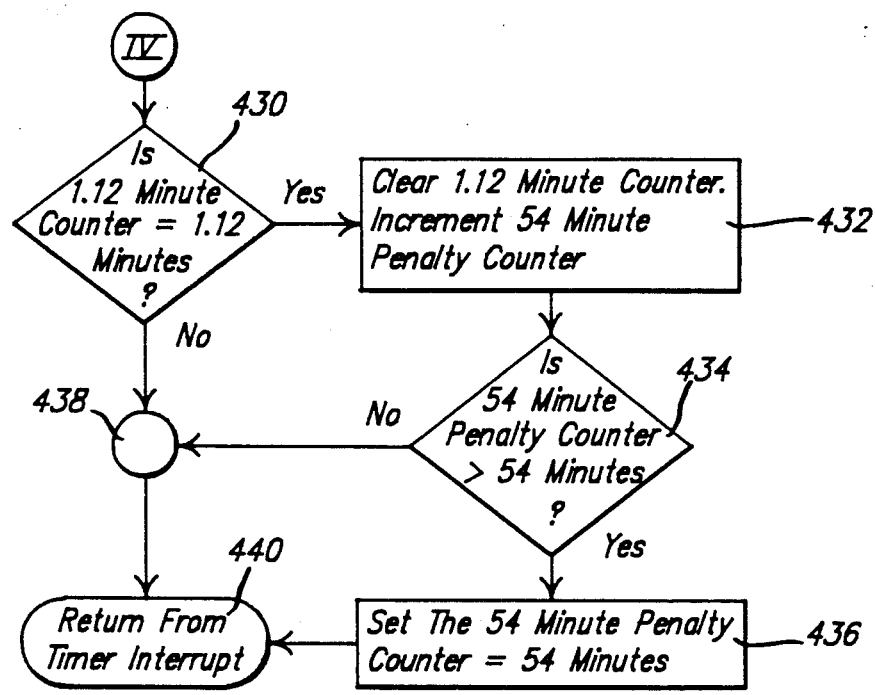

The Timer Interrupt subroutine is shown in FIGS. 4a and 4b. Every 1.024 msec., as determined by the clock oscillator 22, the Main Loop program is interrupted by instruction 410 and the Tachometer Debounce Timer is checked to see if it is at zero (0) at decision step 414. If it is not at zero (0), it is decremented by instruction 412 and a 262 msec. counter is incremented at instruction 415. On the other hand, if the Tachometer Debounce Timer had been equal to zero (0) at decision step 414, it would not be decremented at 412, but the 262 msec. counter would be incremented at instruction 415.

At decision step 416, inquiry is made to determine whether or not 8 msec. has elapsed since the last update of the display on an 8 msec. counter. If 8 msec. have elapsed, the display is updated (refreshed) through a subroutine described below with respect to FIG. 7 and the 8 msec. counter is cleared at instruction 418. If 8 msec. have not elapsed, the Timer Interrupt subroutine progresses from step 416 to decision step 419 to determine if the 262 msec. counter is full. If that counter is not full, the subroutine returns to the Main Loop program by instruction 420. However, if the 262 msec. counter is filled, the 262 msec. elapsed flag is set at instruction 422 and the counter is cleared.

At inquiry step 424, a check is made of the RPM pulse counter to determine if the pulse count is less than 13. The significance of 13 pulses in a period of 262 msec. determines whether or not the speed of the engine is above or below a 1000 rpm level for the particular engine being monitored. In this case, a 6-cylinder engine generating 13 tachometer pulses in a 262 msec. period would be operating at an approximate 1,000 rpm level. If the RPM Pulse Counter is found to contain less than 13 pulse counts, a 54-minute penalty counter is cleared in instruction 426. (The significance of this penalty counter will be later described with respect to the Oil Temp. subroutine shown in FIGS. 6a and 6b.) The RPM Pulse Counter is cleared at instruction 428 and a 1.12 minute counter is incremented.

FIGS. 4a and 4b constitute a single flow chart interconnected with the symbol IV. In FIG. 4b, an inquiry is made at decision step 430 to determine if the 1.12 minute counter has been incremented to a level that is equal to 1.12 minutes. If it is equal to 1.12 minutes, it is cleared at instruction 432 and the 54 minute penalty counter is incremented. A check is made at inquiry step 434 to determine if the penalty counter has exceeded 54 minutes. If it has exceeded 54 minutes, that counter is set to equal 54 minutes at instruction 436 and the subroutine returns to the Main Loop program at instruction 440. If, on the other hand, the 1.12 minute counter is not equal to 1.12 at inquiry step 430, the subroutine proceeds to junction 438 and the return step 440.

Figure 5:
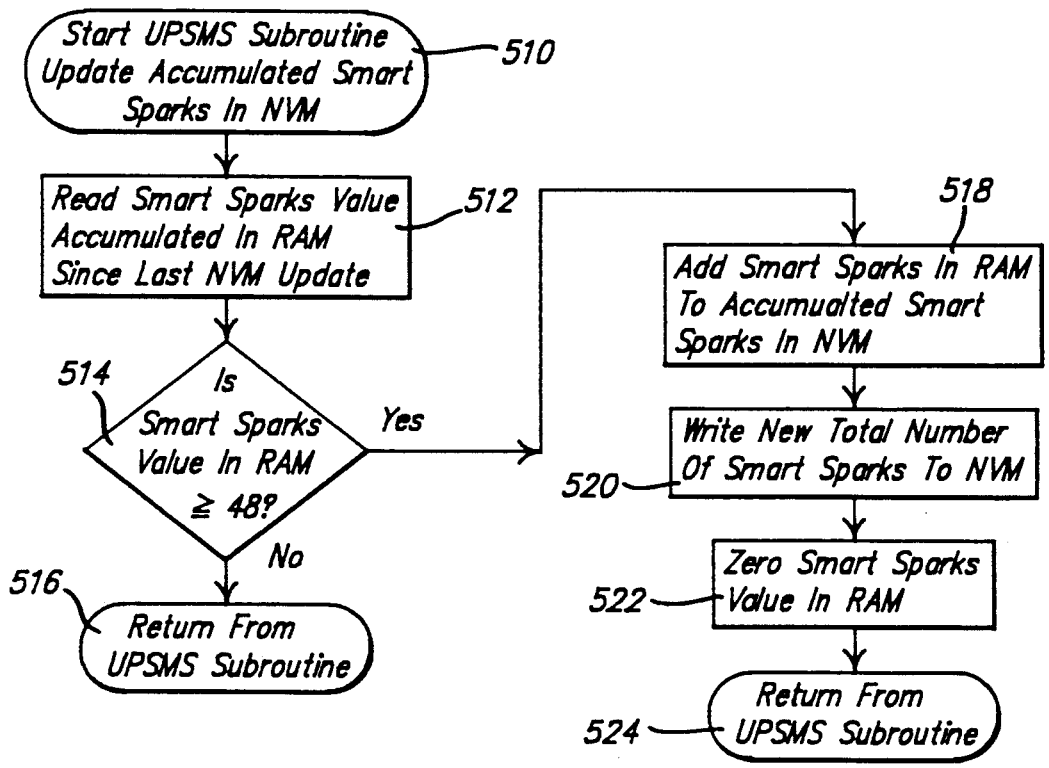
FIG. 5 is a flow diagram of the "Update Smart Sparks" subroutine that is called up by instruction 238 in FIG. 2.

Referring back to the Main Loop program flow chart shown in FIG. 2, instruction 238 calls for the updating of the accumulated Smart Sparks data into the NVM every 262 msec. The Update Smart Sparks (UPSMS) subroutine is shown in FIG. 5, commencing with instruction 510. At instruction 512, the Smart Sparks value accumulated in the RAM since the last NVM update is read from the RAM. Inquiry is made at step 514 to determine if the Smart Sparks value in RAM is greater than or equal to a predetermined value (in this example, the value is 48). If it is not greater than or equal to 48, the updating of the NVM is not made and the subroutine returns at instruction 516 to the Main Loop program.

Although the UPSMS subroutine is called up every 262 msec., updating of the NVM is not made until the second level of weighted speed sensor pulses has accumulated to a significant level to make it worthwhile. This avoids excessive writing to the NVM.

In the event the Smart Sparks value in the RAM is equal to or greater than 48, instruction 518 sums the value of Smart Sparks in RAM with the accumulated Smart Sparks in the NVM. The new total is then written to the NVM at instruction 520. The RAM is cleared at instruction 522 so that the Smart Sparks value stored therein is equal to zero. At instruction 524, the UPSMS subroutine returns to the Main Loop.

Figure 6B:
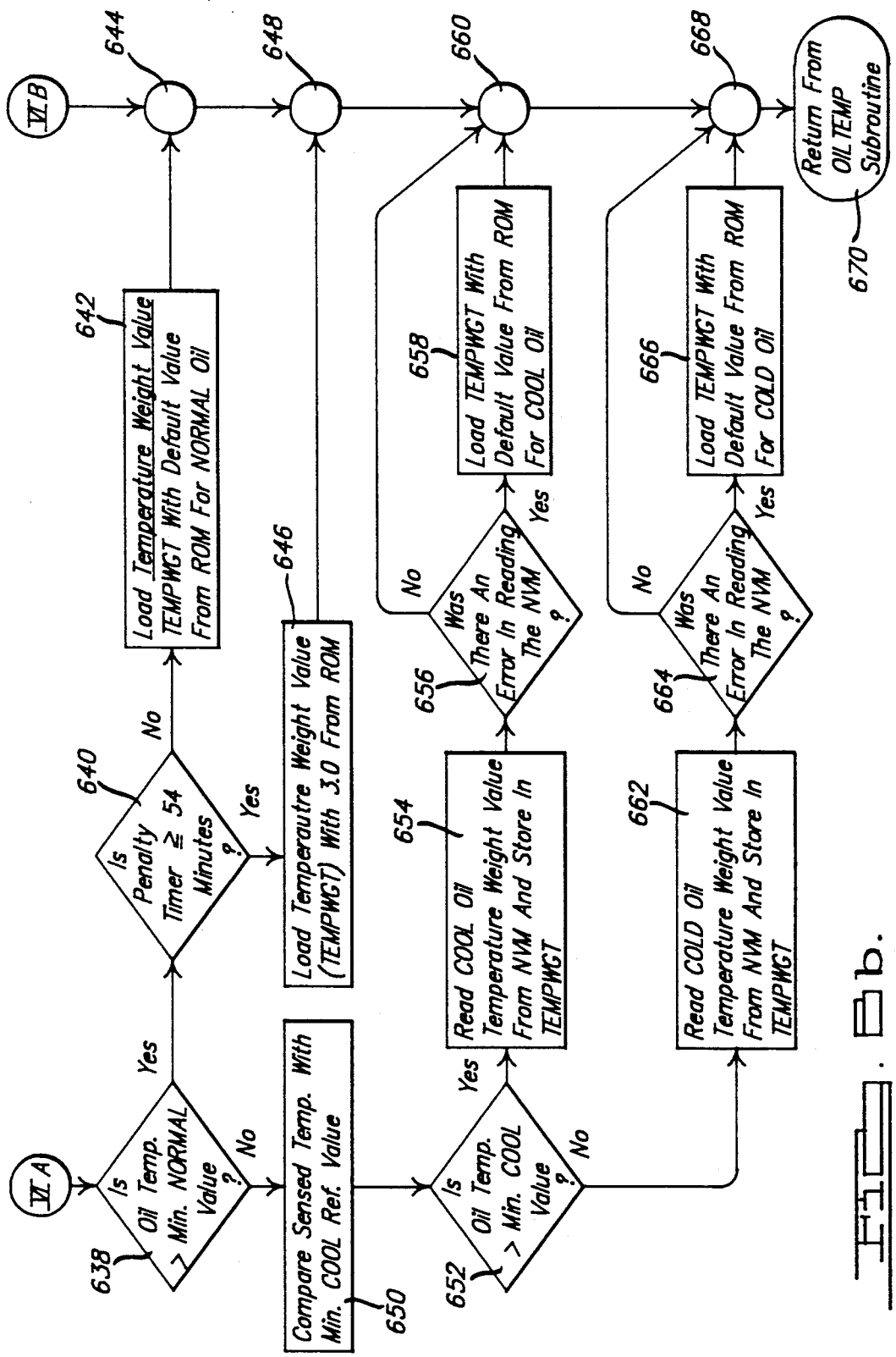

Again referring to the Main Loop program described in the flow chart in FIG. 2, every 262 msec. the Oil Temp Read subroutine is called up at instruction 244. That subroutine is shown in FIG. 6a and 6b wherein the oil temperature is read and TEMP WGT is set in accordance with the oil temperature sensed at that time.

Upon entering the subroutine at instruction 610, the sensed temperature is compared with a minimum Hot reference value in instruction 612. The comparison step is performed in conjunction with the A/D converter 17 detailed in FIG. 8.

The A/D converter 17 includes a pair of input data terminals A and B and a single output data terminal C which are connected to provide temperature data to the microcomputer 20. The input terminals A and B are controlled with predetermined high (1) or low (0) impedance levels with respect to ground and thereby determine appropriately selected reference levels against which comparison of the oil temperature sensor resistance takes place at IC-1. The oil temperature is sensed at junction J-1 which is connected to resistor R17 in series with the thermistor R10 within the oil sump 16 of the engine 14. A voltage divider circuit, comprising resistors R16 and R15 (joined at junction J-1) extends between a power supply voltage $V_b$ and ground. The voltage level at junction J-1 will vary depending upon the resistance value of the thermistor R10 in series with resistor R17. A capacitor C7 is connected between the junction J-1 and ground to provide a shunt for noise pulses. A resistor R14 is connected between the junction J-1 and the negative input terminal of comparator IC-1. A capacitor C8 is connected between the negative input terminal and ground to stabilize the voltage at that terminal.

A reference voltage divider is defined by series connected resistors R19 and R20 between the voltage source $V_b$ and ground. Resistors R19 and R20 are connected at a junction J-2 that is also connected to the positive input terminal of the comparator IC-1. The junction J-2 serves as the reference input to the comparator. A second resistive network comprises resistor R22 in series with the collector of transistor Q6 may be switched in parallel with R20 by the appropriate bias control of the base of Q6 with respect to its ground connected emitter. A third resistive network is connected between the junction J-2 and ground and comprises resistor R21 in series with the collector of transistor Q7. The third resistive network is controlled by the appropriate biasing of the base of the transistor Q7 with respect to its ground connected emitter.

The base of transistor Q6 in the second resistive network is connected to one side of pull-up resistor R13 and to the A input from the microcomputer 20. The base of transistor Q7 is connected to pull-up resistor R12 and to the B input from the microcomputer 20. The other ends of resistors R12 and R13 are connected to a five volt supply so that when the respective A or B inputs are at a high (1) impedance logic level, the bias level at the respective bases will be pulled up to a relatively high voltage level. The corresponding transistor, so biased, will be switched to a conducting state that switches its associated collector connected resistor in parallel with resistor R20. Conversely, when the respective inputs A or B are switched to a relatively low (0) impedance logic level, the bases are biased near ground, thereby disconnecting the correspondingly associated resistive networks.

Figures 8, 9:
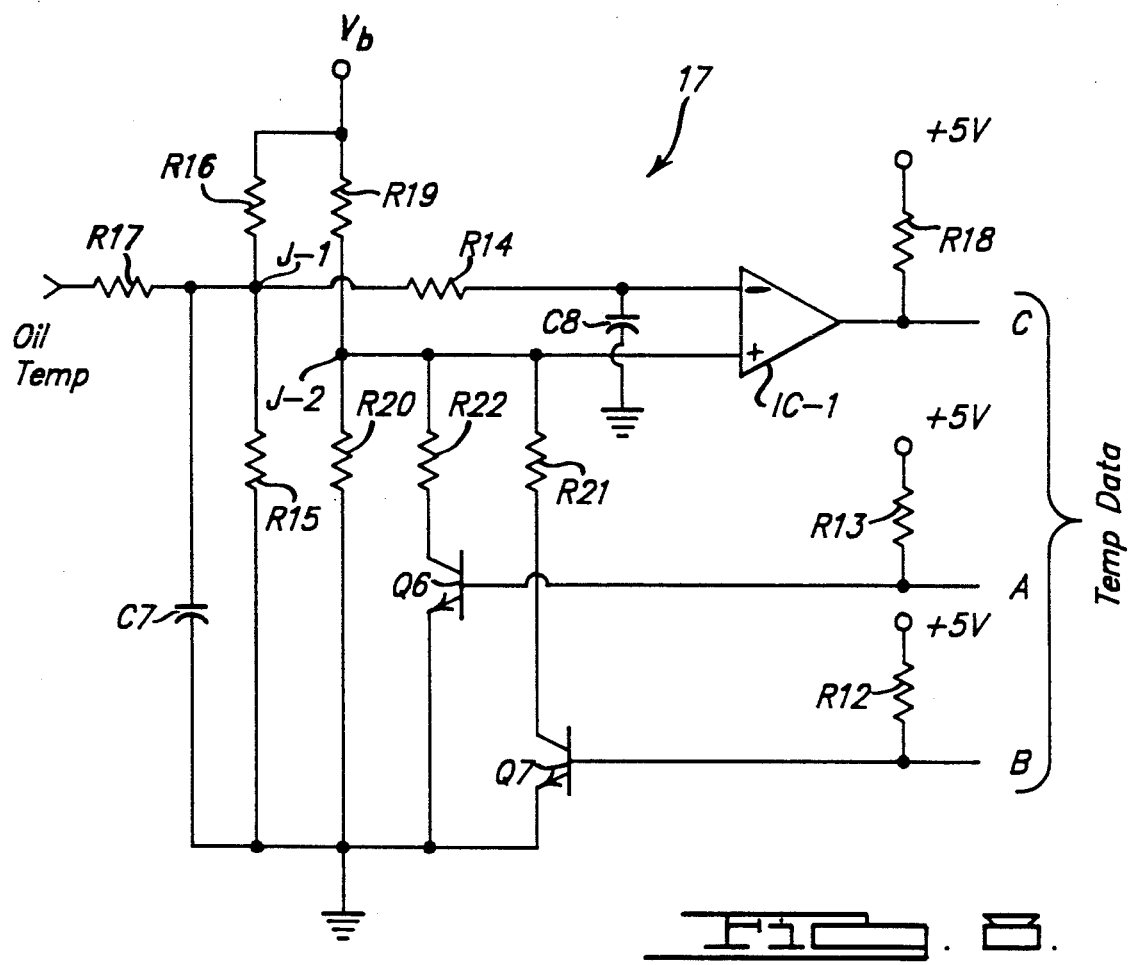
FIG. 8 is a schematic diagram of the A/D converter shown in FIG. 1.
FIG. 9 is a logic table of the interrogation signals associated with the A/D converter.

The table shown in FIG. 9 details the logic codes provided on input terminals A and B and the resulting output logic on terminal C to indicate whether the temperature sensed in the engine oil sump 16 is above or below minimum levels of defined temperature ranges.

For instance, in the instruction 612 shown in FIG. 6a, where the sensed temperature is compared with the minimum Hot reference value (defined as 275° F. in this embodiment), the inputs to terminals A and B on the A/C converter 17 from the microcomputer 20 are high (1) impedance logic levels to bias transistors Q6 and Q7 in conducting states. In that condition the reference voltage at junction J-2 will be at its minimum value determined by the three resistive networks connected in parallel between J-2 and ground. The output of comparator IC-1 provides a high (1) impedance output whenever the voltage at its negative input terminal is less than that at its positive input terminal. It provides a low (0) impedance output whenever the voltage at its negative input terminal is greater than that at its positive input terminal. Therefore, if the sensed temperature causes the voltage at J-1 to be below the minimum determined by the reference voltage at J-2 output C will indicate a high (1) logic output level. If the output C is at a low (0) logic level, the sensed temperature will be determined to be above the reference value.

At inquiry step 614, a check is made to determine if the oil temperature is sensed to be greater than the minimum Hot value. If it is above the minimum Hot value, the Temperature Weight Value corresponding to "Hot Oil" stored in the NVM is read and that value is then stored in the TEMP WGT register. (The Hot Oil Weighting factor is 8, in this embodiment.) The value stored in the TEMP WGT register is the current weighting factor applied to each Spark Pulse to determine the Weighted Spark Pulse Value, as discussed above with respect to FIG. 3. Step 616 reads the appropriate TEMP WGT factor code from the NVM. At inquiry step 618, a check is made to determine if there is an error in the code read from the NVM. If an error occurred in that reading, the TEMP WGT value is loaded with a default value from an internal ROM in the microcomputer 20 that has been defined for Hot Oil. On the other hand, if there was no error in the NVM reading, the subroutine proceeds to junction 622 with the TEMP WGT value from NVM. The Oil Temp subroutine then returns through instruction 670 with the current weigthing factor stored in the TEMP WGT register.

If the oil temperature, as measured in instruction 612 and verified by inquiry step 614 is not greater than the minimum Hot value, the temperature is again sensed at instruction 624 and compared with a minimum Warm reference value (defined as 250° F. in this embodiment). As can be seen from the table, a high (1) impedance logic level is applied to terminal A and a low (0) impedance logic level is applied to terminal B of the A/D converter 17. This, of course, provides a higher reference voltage at junction J-2 than in step 612 because only the second resistive network is connected in parallel with resistor 20. Therefore, a separate comparative reference at J-2 is made with respect to the voltage at junction J-1.

A low (0) logic output level at C indicates that the sensed temperature of the oil is above 250° F. and a high (1) logic output level at C indicates the sensed temperature is below 250° F. At inquiry step 626, a determination of the oil temperature being above the minimum Warm value leads to instruction 628. At instruction 628, the "Warm Oil" Temperature Weight Value is read from the NVM and stored in the TEMP WGT register as the current weighting factor. (The Warm Oil weighting factor is 4, in this embodiment.) Verification steps 630 and 632 are also performed in the event reading errors occur, and the subroutine proceeds to return step 670 via junctions 634, VI B, 644, 648, 660 and 668.

If the oil temperature is determined at step 626 to be below the minimum Warm value, the subroutine proceeds to instruction step 636 where the sensed temperature is compared with a minimum Normal reference value (defined as 140° F. in this embodiment). With reference to the table in FIG. 9, a low (0) impedance logic level is applied to terminal A and a high (1) impedance logic level is applied to terminal B of the A/D converter 17. Such logic levels connect the third resistive network in parallel with resistor R20 and the output terminal C is monitored at inquiry step 638, via junction VI A in FIG. 6b. If inquiry step 638 finds that terminal C is at a low (0) impedance logic level, the oil temperature is determined to be greater than the minimum Normal value and the subroutine proceeds to inquiry step 640. If the 54 minute penalty counter is determined at step 640 to have been incremented to a value that is equal to or greater than 54, a Temperature Weight Value corresponding to a prolonged continuous operation penalty (3, in this embodiment) is loaded into the TEMP WGT register at instruction 646, as the current weighting factor.

If the 54 minute counter is found to contain a value that is less than 54 at inquiry step 640, the TEMP WGT register will be loaded at instruction step 642 with a nominal default value for Normal temperature oil (2, in this embodiment) as the current weighting factor.

If the oil temperature is determined at step 638 to be below the minimum Normal value, the subroutine proceeds to instruction step 650 where the sensed temperature is compared with a minimum Cool reference value (defined as 40° F. in the embodiment). With reference to the table in FIG. 9, low (0) impedance logic levels are applied to both terminals A and B of the A/D converter 17. In that configuration, only the resistor R20 is connected between junction J-2 and ground for a maximum reference level. If terminal C is found to be at a low (0) impedance logic level at inquiry step 652, the oil temperature is determined to be greater than the minimum Cool value and the subroutine proceeds to instruction step 654. At step 654, the Cool Oil Temperature Weight Value (4, in this embodiment) is read from the NVM and stored in the TEMP WGT register as the current weighting factor. Verification steps 656 and 658 are performed in the event reading errors occur and the subroutine proceeds to return step 670 via junctions 660 and 668.

If the oil temperature is determined at step 652 to be below the minimum Cool value, the oil temperature is considered to be Cold and the subroutine proceeds to instruction step 662. At step 662, the Cold Oil Temperature Weight Value (8, in this embodiment) is read from the NVM and stored in the TEMP WGT register as the current weighting factor. Verification steps 664 and 666 are performed in the event reading errors occur.

The OILTEMP subroutine, having determined the current weighting factor according to the sensed temperature of the oil in the engine sump and the length of time the engine has been in continuous operation above a predetermined rpm level and having stored that weighting factor in the TEMP WGT register returns to the Main Loop program at instruction step 670.

Figure 7:
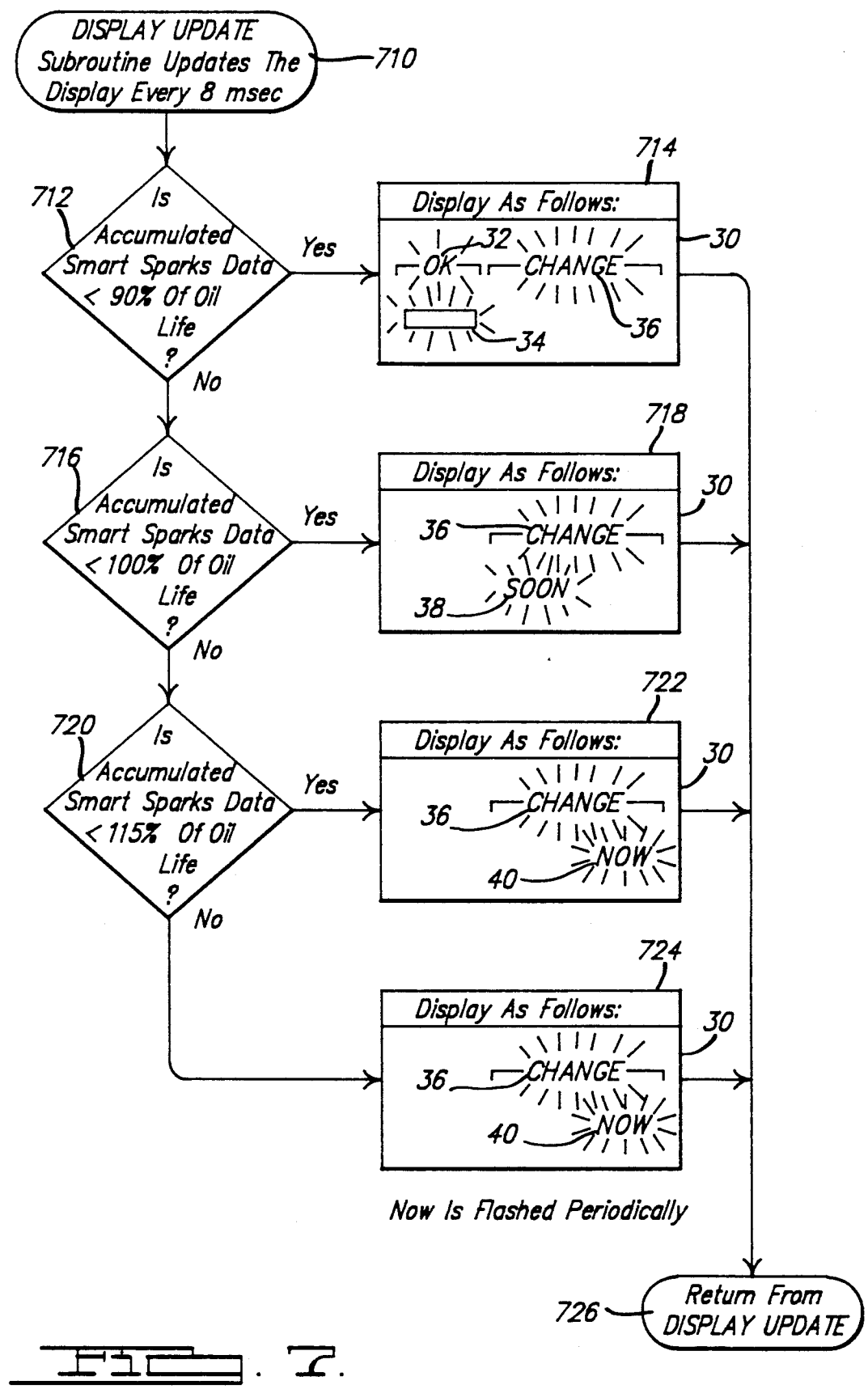
FIG. 7 is a flow diagram of the "Update Display" subroutine that is called up by instruction 417 in FIG. 4.

The Display Update subroutine was mentioned above, in conjunction with the Timer Interrupt subroutine shown in FIGS. 4a and 4b, as being run every 8 msec. The Display Update subroutine is shown in FIG. 7 and commences with instruction 710. At inquiry step 712, following step 710, a determination is made to see if the Accumulated Smart Sparks data in the NVM is less than a first predetermined value. That predetermined value is defined as being 90% of a second predetermined value that corresponds to the predicted maximum wear life of the oil. If the determination at inquiry step 712 is affirmative, the "OK" light and corresponding bar light 34 are illuminated on the display 30 at instruction 714. (The "CHANGE" light 36 is always illuminated for the purpose of indicator reference.) Following step 714, the subroutine returns at step 726 to the Timer Interrupt subroutine (FIG. 4a).

If the answer at inquiry step 712 is in the negative, the accumulated Smart Sparks value in the NVM is equal to or greater than the first predetermined value (90% of wear life) and the subroutine proceeds from step 712 to inquiry step 716. At inquiry step 716, a determination is made to see if the Accumulated Smart Sparks data in the NVM is less than the second predetermined value, which is defined as 100% or the predicted maximum wear life of the oil. If the determination at inquiry step 716 is affirmative, the oil is assumed to be between 90% and 100% of its predicted wear life and the "SOON" light 38 and "CHANGE" light 36 are illuminated on the display 30 at instruction 718. Following step 718, the subroutine returns at step 726 to the Timer Interrupt subroutine (FIG. 4a).

If the answer at inquiry step 716 is in the negative, the accumulated Smart Sparks value in the NVM is determined to be at or greater than 100% of its predicted wear life and the subroutine proceeds to step 720. At inquiry step 720, a determination is made to see if the Accumulated Smart Sparks data in the NVM is less than a third predetermined value, which is defined as 115% of the predicted maximum wear life of the oil. If the determination at inquiry step 716 is affirmative, the "NOW" light 40 and "CHANGE" light 36 are illuminated on the display 30 at instruction 722 to indicate that it is time to change the engine lubricating oil and reset the system. Following step 722, the subroutine returns at step 726 to the Timer Interrupt subroutine (FIG. 4a).

If the answer at inquiry step 720 is in the negative, the accumulated Smart Sparks value in the NVM is determined to be at or greater than 115% of its predicted wear life and the subroutine proceeds to instruction step 724. At instruction step 724, the "CHANGE" light 36 is illuminated and the "NOW" light 40 is flashed at a predetermined rate in order to communicate added urgency of having the engine oil changed. Following step 724, the subroutine returns at step 726 to the Timer Interrupt subroutine (FIG. 4a).

By providing the described method and apparatus, the present invention reliably predicts and tracks the safely usable wear life of engine lubricating oil and provides a staged warning display for different degrees of urgency at and near the critical end of the predicted useful wear life.

We claim:
1. A lubricating oil change indicating system for an internal combustion engine comprising:
   means for sensing the speed of engine operation and outputting electrical pulses at a rate proportional to said engine speed;
   means for sensing the temperature of the lubricating oil;
   means for measuring the time the engine is in continuous operation above a predetermined speed;
   means for periodically sampling the temperature sensing means and said time measuring means and outputting a then current weighting factor according to predetermined levels of sensed temperature and the continuous time said engine has been in operation above said predetermined speed;
   means for multiplying each output pulse from said speed sensing means by the then current weighting factor to produce a corresponding weighted pulse value;
   means for accumulating the weighted pulse values to produce an accumulated pulse value;
   means for comparing the accumulated pulse value with a predetermined value that corresponds to a prescribed wear limit for said lubricating oil;
   means for signaling an indication of the necessity for changing the lubricating oil when said comparing means determines that said accumulated pulse value exceeds said predetermined value; and
   means for resetting said time measuring means whenever said speed sensing means outputs pulses at a rate that is proportional to an engine speed below said predetermined speed.

* * * * *